United States Patent [19]
Kojima

[11] Patent Number: 6,118,128
[45] Date of Patent: Sep. 12, 2000

[54] ALIGNMENT MARK FOR ELECTRON BEAM LITHOGRAPHY

[75] Inventor: Yoshiki Kojima, Tokyo, Japan

[73] Assignee: Mitsubishi Denki Kabushiki Kaisha, Tokyo, Japan

[21] Appl. No.: 09/086,616

[22] Filed: May 29, 1998

[30] Foreign Application Priority Data

Nov. 26, 1997 [JP] Japan .................................. 9-324346

[51] Int. Cl.$^7$ .............................. G01N 21/00; G01J 1/00
[52] U.S. Cl. .................................... 250/491.1; 250/492.2
[58] Field of Search .............................. 250/491.1, 492.2

[56] References Cited

U.S. PATENT DOCUMENTS

| | | | |
|---|---|---|---|
| 4,642,672 | 2/1987 | Kitakata | 250/491.1 |
| 4,737,646 | 4/1988 | King et al. | 250/491.1 |
| 5,523,576 | 6/1996 | Koike et al. | 250/491.1 |
| 5,708,276 | 1/1998 | Ohkawa et al. | 250/491.1 |

FOREIGN PATENT DOCUMENTS

| | | |
|---|---|---|
| 61-241610 | 10/1986 | Japan . |
| 8273997 | 10/1996 | Japan . |

*Primary Examiner*—Bruce C. Anderson
*Attorney, Agent, or Firm*—Leydig, Voit & Mayer, Ltd.

[57] ABSTRACT

An alignment mark for fabricating a semiconductor device having a high density of circuit patterns and fine patterns using electron beam lithography techniques. No electrical charging of the alignment mark occurs during several scans by the electron beam. The area of a conductive layer and the area where the surface of a semiconductor substrate is exposed are reversed from those of the conventional alignment mark. The novel alignment mark includes a surface of the semiconductor substrate exposed through a conductive layer on the semiconductor substrate.

16 Claims, 4 Drawing Sheets

ALIGNMENT MARK FOR ELECTRON BEAM LITHOGRAPHY

BACKGROUND OF THE INVENTION

1. Field of the Invention

The present invention relates to an alignment mark used in electron beam lithography techniques. More particularly, it relates to an alignment mark used in fabrication of fine patterns in a high-density.

2. Description of the Related Art

Since it is indispensable to reduce the gate length for making a field effect transistor having higher performance, a method of lithography which uses an electron beam is employed when fabricating such fine patterns.

FIGS. 4A–4D show an alignment mark used in the conventional electron beam lithography process. FIG. 4A is a top view of a global alignment mark used in relatively rough alignment, and FIG. 4B is a cross sectional view thereof taken along the line 4B—4B. FIG. 4C is a top view of a fine alignment mark used in high-precision alignment which is carried out after the rough alignment, and FIG. 4D is a cross sectional view taken along line 4D—4D. In the drawing, numeral 1301 denotes a metal layer for the global alignment mark, 1304 denotes a semiconductor substrate, 1401 denotes a metal layer for the fine alignment mark, 1402 denotes an electron beam and 1404 denotes a semiconductor substrate. An alignment mark is fabricated generally by forming a cross-shaped metal layer having a convex cross section on a semiconductor substrate.

Such an alignment mark is detected as follows. As shown in FIG. 4D, for example, the electron beam 1402 is scanned over the semiconductor substrate 1404 which is covered with a resist (not shown) and electrons reflected from the semiconductor substrate 1404 and the metal layer 1401 upon irradiation by the electron beam 1402 are detected by means of a detector (not shown), thereby locating the alignment mark position on the basis of the intensity of the reflected electron flux. The electron beam 1402 that has reached the semiconductor substrate 1404 and the metal layer 1401 is discharged outside of the semiconductor substrate through an earth line (not shown in the drawing) or the like which is connected to the semiconductor substrate surface.

Scanning of the electron beam 1402 is usually carried out a plurality of times, with measured data being averaged in order to locate the alignment mark position accurately.

Generally a global alignment mark is formed by depositing a metal layer having a cross shape with a width of 1 μm to 1 mm within a square area measuring 50 μm to 3 mm on one side on a semiconductor substrate. A fine alignment mark is formed by depositing a metal layer having a cross shape with a width of 1 μm to 300 μm within a square area measuring 5 μm to 1 mm on one side on a semiconductor substrate. As semiconductor elements become packaged in increasingly higher density, the size of the area wherein the alignment mark is formed decreases which makes it necessary to decrease the width and length of the alignment ark, as well.

As the alignment mark becomes finer, electrons landing on the alignment mark during irradiation become difficult to move onto the semiconductor substrate, thus making it likely that electrons build up on the alignment mark in the so-called charge-up phenomenon (charge concentration). Such charged-up electrons exert a repulsive force on the incident electron beam, thus making it difficult to detect the alignment mark position accurately.

In order to solve this problem, the present inventors attempted to suppress the effect of charge-up by reducing the number of electron beam scans. With this method, although charge-up can be reduced, the amount of data obtained for locating the alignment mark position decreases thus leading to lower accuracy in locating the alignment mark position, and alignment becomes particularly extremely difficult in sub-micron dimensions which are indispensable for making a T-shaped gate of an HEMT shown in FIG. 3. Thus it was found that this method cannot be applied to the formation of fine patterns in a high density.

SUMMARY OF THE INVENTION

An object of the present invention is to provide an alignment mark for electron beam lithography used in making fine patterns in a high density, which is not likely to cause charge-up after a making plurality of electron beam scans and is therefore capable of accurately detecting the alignment mark position.

The present inventors have intensively studied and found that the area of a conductive film region can be increased, and charge-up on the conductive film can be decreased even when the area wherein the alignment mark is to be formed is the same, by inverting the region where the conductive film is formed and the region where the semiconductor substrate surface is exposed, and forming an alignment mark comprising such a groove as the semiconductor substrate surface is exposed in the conductive film formed on the semiconductor substrate. Thus, the present invention has been completed.

According to the present invention, there is provided an alignment mark for electron beam lithography, comprising a narrow groove formed so that the semiconductor substrate surface is exposed in a region of the conductive film formed on the semiconductor substrate, wherein an electron beam is scanned over the semiconductor substrate and the amount of electrons reflected from the conductive film and the semiconductor substrate surface in the groove is measured, thereby to locate the alignment mark position.

Because such a configuration is employed as the configuration of the conventional alignment mark is inverted, namely a recess formed in the conductive layer is used as the alignment mark, the area of the conductive region can be increased even with the same area of the alignment mark forming region, thus making it possible to reduce the charge-up on the conductive layer.

As a result, it is made possible to carry out such a number of electron beam scans which would cause charge-up on the conductive layer in the prior art, resulting in improved accuracy of detecting the alignment mark which enables it to fabricate fine patterns with high accuracy.

Japanese Patent Kokai Publication No. 61-241610 discloses a method of detecting a center position of a cross mark which is formed by exposing a cross-shaped Cr region in an Al film. First, this method involves wide patterns and is applicable only to patterns where light of a long wavelength about 20 μm is used in detection, and is not applicable to patterns with mark width of several micrometers such as that of the present invention. Secondly, when the position is detected by means of light as in the detection method described above, the problem of charge-up does not occur and, in this respect, it belongs to a field different from that of the present invention.

The present invention, in view of the necessity to detect fine patterns, employs an electron beam of shorter wavelength in the detection instead of light as in the prior art, and aims at reducing the charge-up which has significant influence on the detection of fine patterns formed in a high density.

The alignment mark is preferably two grooves crossing each other at right angles.

By using a cross-shaped alignment mark comprising two mutually perpendicular grooves, it is made easier to locate the position of the alignment mark arranged in two perpendicular directions (X-axis direction and Y-axis direction).

The semiconductor substrate may be a low-conductivity substrate.

In the conventional configuration of alignment mark, when the substrate is made of a low conductivity material, charge-up is likely to occur because electrons are less likely to be released into the substrate. In the alignment mark configuration of the present invention, in contrast, charge-up is less likely to occur even when a substrate having low conductivity is used, and the alignment mark position can be located with a high accuracy.

The low conductivity substrate refers to a substrate having carrier concentration in a range from $5 \times 10^{16}$ to $1 \times 10^{19}/cm^3$.

The semiconductor substrate is preferably a gallium arsenide substrate or an indium phosphide substrate.

The conductive layer is preferably made of a metal. It is because the use of a metal having high conductivity makes it possible to reduce the occurrence of charge-up.

The metal is preferably Au or its compound, or WSi or its compound.

It is because the use of such a material makes it possible to form the alignment mark simultaneously in ohmic electrode forming process or in gate electrode forming process, thus reducing the number of manufacturing processes.

As will be clear from the above description, according to the present invention, area of the conductive region can be made larger with the same area of alignment mark forming region by employing a configuration inverted from the conventional alignment mark configuration, namely by using a recess formed in the conductive layer as the alignment mark, thereby making it possible to reduce charge-up on the conductive layer.

Therefore, it is made possible to carry out such a number of electron beam scans which would cause charge-up on the conductive layer in the prior art, resulting in improved accuracy of detecting the alignment mark which enables it to fabricate fine patterns with high accuracy.

Also by making the alignment mark in a cross shape, it is made easier to locate the position of the alignment mark in two perpendicular directions (X-axis direction and Y-axis direction).

When the substrate is made of a low conductivity material, charge-up is likely to occur because electrons are less likely to be released into the substrate in the conventional alignment mark configuration, but the use of the alignment mark configuration of the present invention makes charge-up less likely to occur even when a substrate made of a material having low conductivity is used, and the alignment

DESCRIPTION OF THE PREFERRED EMBODIMENTS

Embodiment 1

A first embodiment of the present invention will now be described below taking reference to FIG. 1.

Figure 1A:
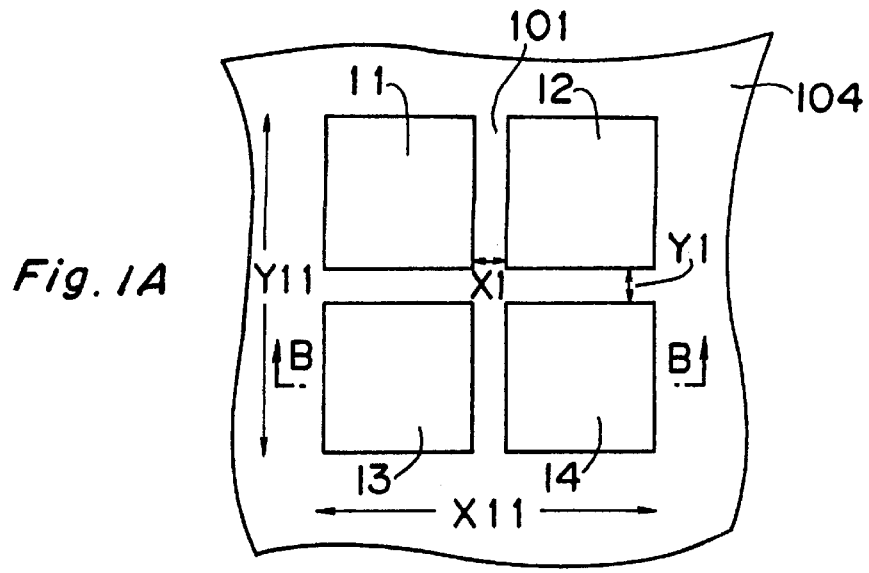
FIGS. 1A and 1B are respectively a top view of the global alignment mark according to the first embodiment of the present invention and a cross sectional view taken along the line 1B—1B.
Figure 1B:
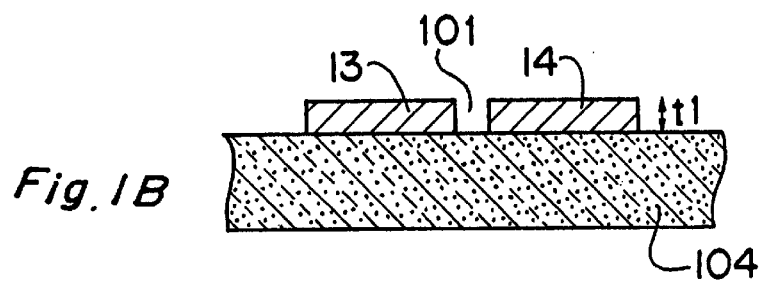
Figure 1C:
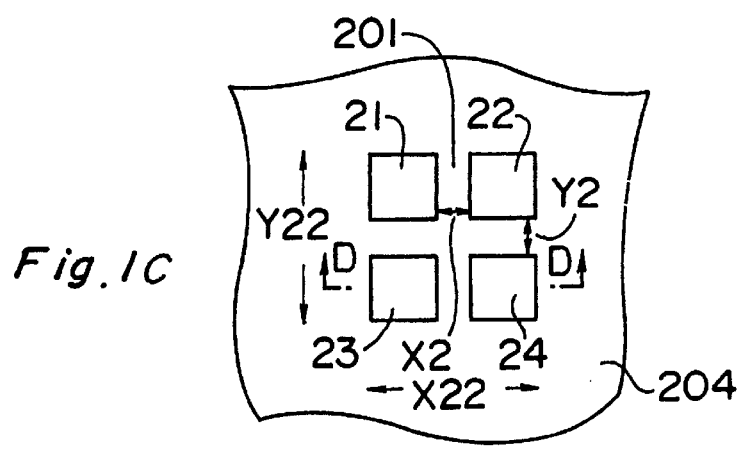
FIGS. 1C and 1D are respectively a top view of the fine alignment mark according to the first embodiment of the present invention and a cross sectional view taken along the line 1D—1D.

FIG. 1 shows an alignment mark used in the electron beam lithography technique according to the embodiment of the present invention, while FIG. 1A is a top view of a global alignment mark used in relatively rough alignment, and FIG. 1B is a cross sectional view taken along the line 1B—1B. FIG. 1C is a top view of a fine alignment mark used in high-precision alignment which is carried out after the rough alignment, and FIG. 1D is a cross sectional view taken along the line 1D—1D.

The alignment mark for electron beam lithography according to the embodiment comprises marks 101, 201 which comprise grooves formed by exposing the surface of the semiconductor substrates 104, 204 interposed between conductive layers 11 to 14 and 21 to 24 which are provided on the semiconductor substrates 104, 204. By scanning an electron beam 202 over the semiconductor substrates 104, 204 and measuring the quantity of electrons reflected from the semiconductor substrates 104, 204 and the conductive layer 11, the positions of the marks 101, 201 are determined. In the drawing, numeral 101 denotes a global alignment mark, 104 denotes a semiconductor substrate, 11 through 14 denote metal layers, 201 denotes a fine alignment mark, 202 denotes an electron beam, 204 denotes a semiconductor substrate and 21 through 24 denote metal layers.

The global alignment mark 101 shown in FIGS. 1A, 1B is surrounded by the metal layers 11, 12, 13, 14 and is formed as grooves where surface of the semiconductor substrate 104 is exposed in a cross shape between the metal layers. The metal layers 11, 12, 13, 14 are made in the same layer structure. In this embodiment, for example, the metal layers are made in 3-layer structure of AuGe/Ni/Au, from the bottom to the top, with the total thickness t1 of the three layers is set to 1000 Å to 5000 Å. Dimensions of the alignment mark 101 are set as X1=Y1=1 μm to 1 mm. Dimensions of the entire cross are set as X11=Y11=50 μm to 3 mm.

Dimensions of the alignment mark 101 are most preferably as follows.

X1=Y1=3 to 10 μm

X11=Y11=2000 to 3000 μm

By making the alignment mark 101 in the 3-layer structure of AuGe/Ni/Au, it is made possible to form the alignment mark 101 simultaneously in the process of manufacturing the ohmic electrode of the semiconductor element.

Figure 2A:
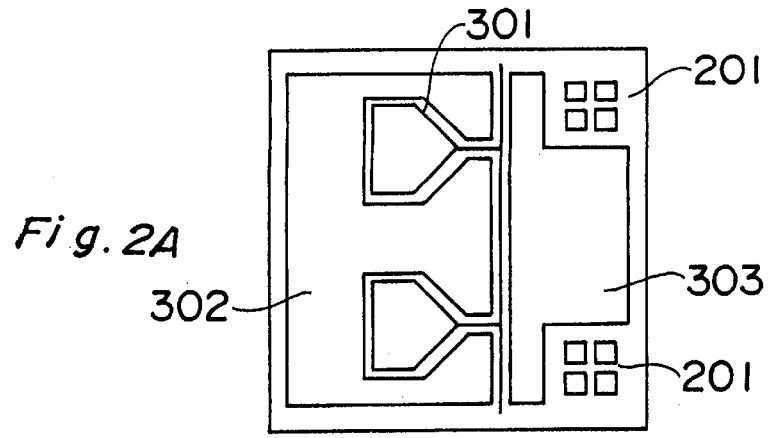
FIG. 2A is a top view of the HEMT according to the second embodiment of the present invention.
Figure 2B:
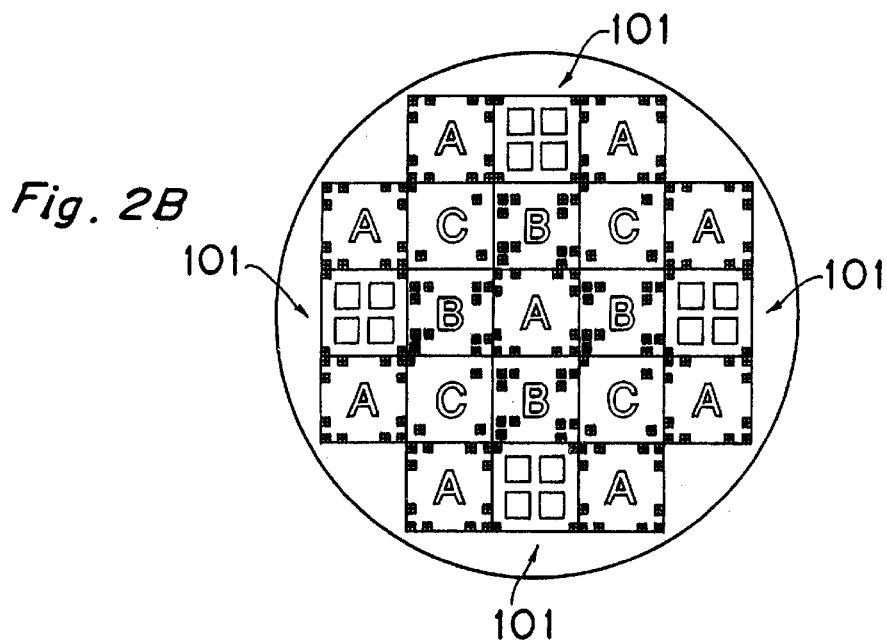
FIG. 2B is a top view of the semiconductor substrate according to the second embodiment of the present invention.

The fine alignment mark 201 of FIGS. 2A, 2B is used to carry out more accurate alignment, after making rough alignment (correction of position) by means of the global alignment mark 101. The metal layers 21 through 24 of the fine alignment mark 201 are made in the same layer structure as the global alignment mark 101, namely in the 3-layer structure of AuGe/Ni/Au, from bottom to top. Total thickness t2 of the metal layers 21 and others is set to 1000 Å to 5000 Å. Dimensions of the alignment mark 204 are set as X2=Y2=1 μm to 300 μm, and dimensions of the entire cross are set to X22=Y22=5 μm to 1 mm.

Figure 1D:
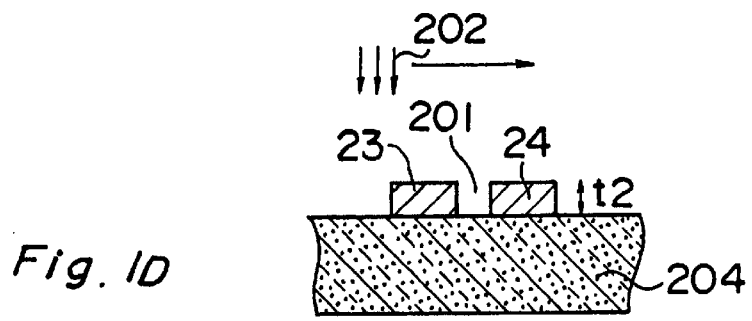

Now the method of detecting the alignment marks will be described below by taking the fine alignment mark 201 of FIG. 1D as an example. First, the electron beam 202 is scanned over the semiconductor substrate 204 and the metal layers 23, 24 in lateral direction (X-axis direction) and the amount of electrons reflected from the semiconductor substrate 204 and the metal layers 23, 24 upon irradiation of the electron beam 202 is measured by means of a detector (not shown in the drawing). From the change in the amount of the reflected electrons, position of the alignment mark 201 surrounded by the metal layers 23, 24 is located. Scanning of the electron beams 202 is carried out a plurality of times, while the position data of the alignment mark 201 thus obtained are averaged to make final determination of the alignment mark position. Therefore, increasing the number of times the electron beam 202 is scanned improves the accuracy of locating the alignment mark 201 position.

Through such a procedure as described above, position of the alignment mark 201 in lateral direction (X-axis direction) can be located.

The position of the alignment mark 201 in longitudinal direction (Y-axis direction) can also be located in a similar procedure.

Data of the position in X-axis and Y-axis directions thus obtained is used in the formation of fine patterns that follows.

When scanning the electron beam 202 over the fine alignment mark 201, the electron beam 202 may also be scanned over the global alignment mark 101 at the same time.

Thus because the semiconductor substrates 104, 204 which are exposed in cross shape and are surrounded by the metal layers 11 through 14 and 21 through 24 are used for the alignment marks 101, 201 of this embodiment, the area occupied by the metal layers 11 through 14 and 21 through 24 in the alignment mark forming region is larger in comparison to the case of the conventional alignment marks 1301, 1401 (FIG. 4), and therefore charge-up of electrons on the metal layers 11 through 14 and 21 through 24 is unlikely to occur.

This is because the metal layers 11 through 14 and 21 through 24 are larger in volume and have large contact area with the semiconductor substrates 104, 204, and therefore electrons (charged particles) which have reached the surfaces of the metal layers 11 through 14 and 21 through 24 can be efficiently diffused into the metal layer 11 or the semiconductor substrates 104, 204, thus making it possible to suppress the charge-up.

As a result, charge-up does not occur even when the electron beam is scanned a plurality of times, unlike in the case of the conventional configuration (FIG. 4), thus making it possible to detect the alignment mark position with high accuracy.

Although the global alignment mark 101 and the fine alignment mark 201 are made in the 3-layer structure of AuGe/Ni/Au in this embodiment, other materials may also be used as well, provided that the material is a conductive metallic material different from that of the semiconductor substrate.

In case the substrate is made of a compound semiconductor based on GaAs or InP, for example, the alignment marks may be formed from a material based on Au, WSi, Pt or Ti.

As a result, because the alignment marks can be formed by using the same material as that of the ohmic electrode or the gate electrode, it is made possible to form the alignment marks at the same time in the ohmic electrode forming process or the gate electrode forming process.

Embodiment 2

A second embodiment of the present invention will now be described below taking reference to FIG. 2. FIG. 2A is a top view of HEMT of a T-shaped gate which is a compound semiconductor device made by using the global alignment mark 101 and the fine alignment mark 201 described in conjunction with the first embodiment. In the drawing, numeral 301 denotes a gate electrode and 302 and 303 denote ohmic electrodes.

Fabricating the HEMT requires it to provide the global alignment marks 101 at two or more locations on the semiconductor substrate 304 as shown in FIG. 2B. Typically the global alignment marks 101 are provided at four locations. That is, alignment of the semiconductor substrate 304 is carried out by first making rough alignment by using the global alignment marks 101 provided at two or more places.

Figure 2C:
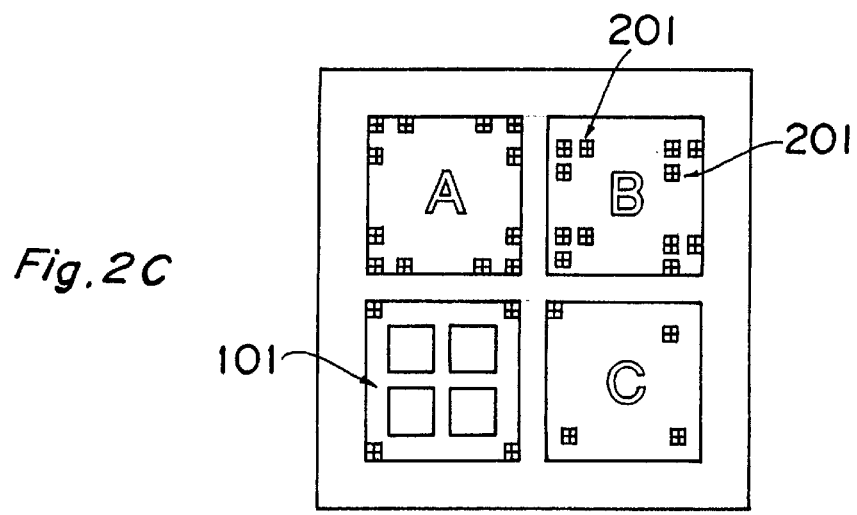
FIG. 2C is a layout diagram of a reticle circuit pattern for reduced projection lithography according to the second embodiment of the present invention.

Then the semiconductor substrate 304 which has been aligned by using the global alignment marks 101 is subject to alignment of higher accuracy by using the fine alignment marks 201. While the required number of the fine alignment marks 201 depends on the marking condition required in the electron beam lithography process, it is necessary to provide the fine alignment marks 201 at three or more places in the region wherein reduced projection lithography is carried out in one shot, or at one or more places in each quadrant for the one shot. FIG. 2C shows a photo mask for reduced projection lithography. In the drawing, letters A, B and C denote circuit patterns of a semiconductor device with each of A, B, C representing a unit of area subject to the reduced projection lithography in one shot.

When making the HEMT shown in FIG. 2A, usually two or more HEMT chips are formed in the semiconductor device which is formed in one shot. Therefore, by forming one or more fine alignment mark 201 for each chip of the HEMT, alignment can be done as usual with no regard to the marking condition required in an electron beam lithography apparatus, even when the electron beam lithography apparatus of different specifications is used.

FIGS. 3A through 3F show cross sectional views of a process of forming a T-shaped gate electrode of HEMT using the global alignment marks 101 and the fine alignment marks 201.

Figure 3A:
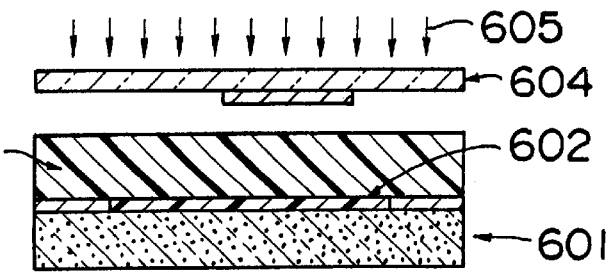
FIG. 3 shows the manufacturing process of the T-shaped electrode of the HEMT according to the second embodiment of the present invention.

First, as shown in FIG. 3A, a resist for electron beam lithography (lower resist layer) 602 such as PMGI is formed with a thickness of 1000 to 3000 Å on the semiconductor substrate 601 made of GaAs or the like, then a photoresist (upper resist layer) 603 is formed with a thickness of 5000 to 20000 Å on the resist for electron beam lithography 602.

Figure 3B:
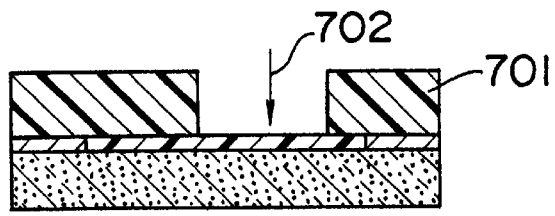

Then only the photoresist 603 is exposed to light 605 by using a photo mask 604 for forming the upper resist pattern and the reduced projection lithography apparatus (not shown in the drawing) and developed, thereby to form an upper electrode pattern 701 of the T-shaped gate electrode shown in FIG. 3B.

Numeral 1201 denotes a source/drain electrode which is made in advance.

Figure 3C:
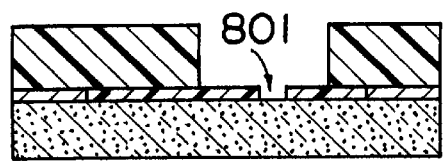

Then as shown in FIG. 3C, a region wherein the lower electrode pattern of the T-shaped gate is to be formed in an opening of the upper electrode pattern 701 of the T-shaped gate electrode is irradiated with a converged electron beam 702, thereby to directly draw a lower electrode pattern 801. At this time, in order to prevent the upper electrode pattern 701 and the lower electrode pattern 801 from being displaced from each other, the lower electrode pattern 801 must be formed accurately in the opening of the upper electrode pattern 701. For this reason, the global alignment mark 101 used in rough alignment and the fine alignment mark 201 used in accurate alignment which are formed in advance on the semiconductor substrate 601 are scanned with the electron beam a plurality of times to locate the positions thereof, and the accurate position where the lower electrode pattern 801 is formed is determined while correcting the deviation from the design value according to the position thus located, thereby exposing the position to irradiation.

The global alignment mark 101 is formed from an opening made by exposing the semiconductor substrate surface provided in the shape of cross with a width of 1 $\mu$m to 1 mm within a metal region measuring 50 $\mu$m to 3 mm on one side on the semiconductor substrate 601. The fine alignment mark 201, on the other hand, is formed from an opening made by exposing the semiconductor substrate surface provided in the shape of cross with a width of 1 $\mu$m to 300 $\mu$m within a metal region measuring 5 $\mu$m to 1 mm on the semiconductor substrate 601.

Therefore, charge-up is not likely to occur even when the electron beam is scanned a plurality of times, unlike the conventional configuration, thus making it possible to locate the alignment mark position more accurately.

When forming the gate electrode of the HEMT, it is necessary to make the opening of the upper electrode pattern 701 have a width of about 1 $\mu$m and form the lower electrode pattern 801 having a width of about 0.1 $\mu$m at a specified position in the opening. Thus by using the alignment marks of the present invention, it is made possible to form a gate pattern of high accuracy and to greatly reduce defects of forming the gate electrode which have been occurring in the prior art.

By directly drawing the pattern by means of lithography of a specified position of the resist 602 for electron beam lithography through exposure to the electron beam and development of the image, the lower electrode resist pattern 801 is obtained as shown in FIG. 3C.

Figure 3D:
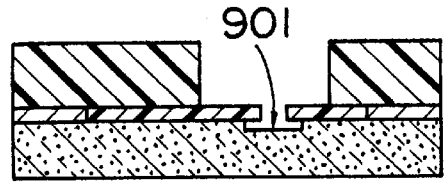

Then as shown in FIG. 3D, the semiconductor substrate 601 is subject to wet etching by using the T-shaped gate resist pattern 801 as the mask, thereby to form a recess 901 in a portion of the semiconductor substrate 601 surface.

Figure 3E:
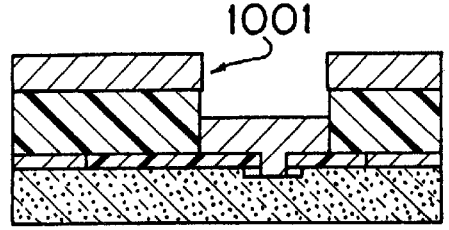
Figure 3D:
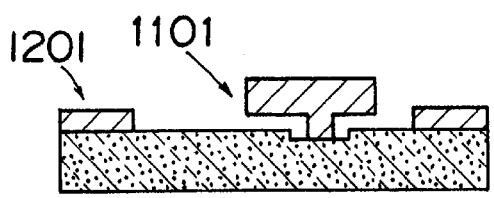
Figure 4A:
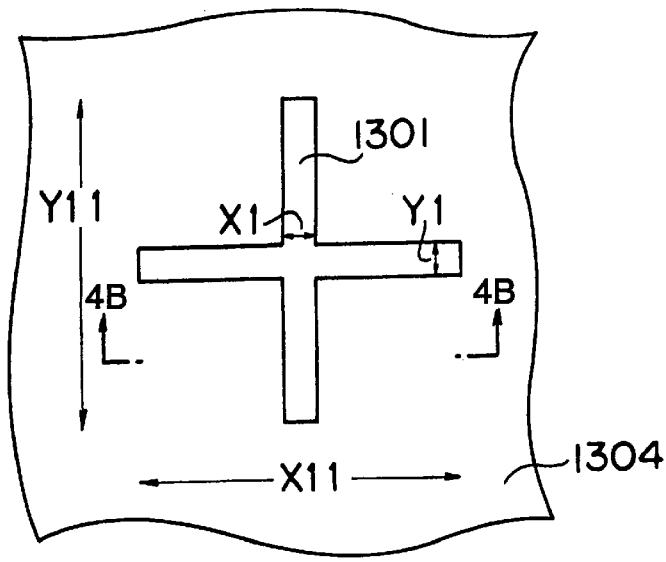
FIGS. 4A and 4B are respectively a top view of the global alignment mark of the prior art and a cross sectional view taken along the line 4B—4B.
Figure 4B:
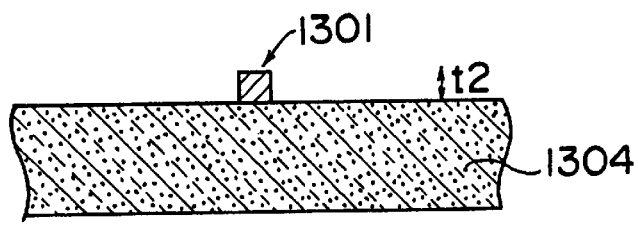
Figure 4C:
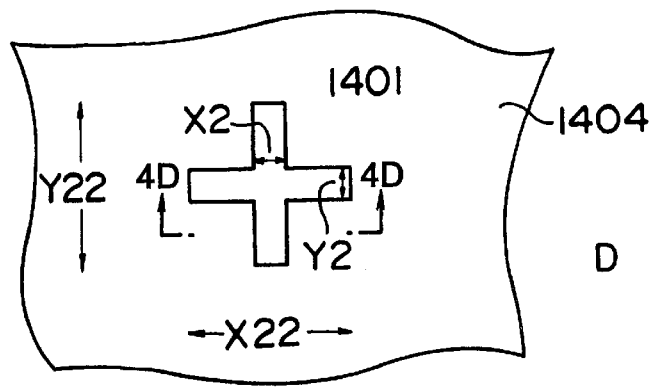
FIGS. 4C and 4D are respectively a top view of the fine alignment mark of the prior art and a cross sectional view taken along the line 4D—4D.
Figure 4D:
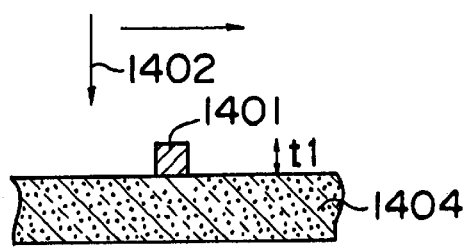

Then as shown in FIG. 3D, by depositing a gate electrode metal 1001 such as Al over the entire surface, unnecessary portion of the gate electrode metal 1001 is removed by lift-off method, thereby to obtain T-shaped gate electrode 1101 shown in FIG. 3E.

While the T-shaped gate electrode of the HEMT is made by using the alignment marks according to the present invention in the process described above, the alignment marks can be formed at the same time during the process of making the ohmic electrode by using the same material as that of the ohmic electrode 1201 which is made before forming the gate electrode.

What is claimed is:

1. An alignment mark in a semiconductor substrate for electron beam lithography comprising:

a semiconductor substrate;

a conductive film on a surface of the semiconductor substrate; and first and second grooves intersecting at a right angle, extending through the conductive film to and thereby exposing a surface of the semiconductor substrate, whereby, when an electron beam is scanned over the semiconductor substrate, electrons reflected from the conductive film and from the semiconductor substrate surface in the first and second grooves are measured to locate the alignment mark.

2. The alignment mark as claimed in claim 1, wherein the semiconductor substrate is a low-conductivity substrate.

3. The alignment mark as claimed in claim 2, wherein the carrier concentration of the substrate is in a range from $5\times10^{16}$ to $1\times10^{19}/\text{cm}^3$.

4. The alignment mark as claimed in claim 1, wherein the semiconductor substrate is one of gallium arsenide and indium phosphide.

5. The alignment mark as claimed in claim 1, wherein the conductive layer is a metal.

6. The alignment mark as claimed in claim 1, wherein the metal is selected from the group consisting of Au, WSi, Pt, Ti, and compounds of these metals.

7. The alignment mark as claimed in claim 5, wherein the metal is the same metal as a gate electrode.

8. The alignment mark as claimed in claim 1, wherein the conductive layer is a 3-layer structure of AuGe/Ni/Au.

9. A semiconductor device comprising:

a semiconductor substrate;

a conductive film on a surface of the semiconductor substrate;

a gate electrode with a gate length less than a micrometer; and an alignment mark for electron beam lithography comprising:
   first and second grooves intersecting at a right angle, extending through the conductive film to and thereby exposing a surface of the semiconductor substrate, whereby, when an electron beam is scanned over the semiconductor substrate, electrons reflected from the conductive film and from the semiconductor substrate surface in the first and second grooves are measured to locate the alignment mark.

10. The semiconductor device as claimed in claim 9, wherein the semiconductor substrate is a low-conductivity substrate.

11. The semiconductor device as claimed in claim 10, wherein the carrier concentration of the substrate is in a range from $5\times10^{16}$ to $1\times10^{19}/\text{cm}^3$.

12. The semiconductor device as claimed in claim 9, wherein the semiconductor substrate is one of gallium arsenide and indium phosphide.

13. The semiconductor device as claimed in claim 9, wherein the conductive layer is a metal.

14. The semiconductor device as claimed in claim 13, wherein the metal is the same metal as a gate electrode.

15. The semiconductor device as claimed in claim 9, wherein the metal is selected from the group consisting of Au, WSi, Pt, Ti, and compounds of these metals.

16. The semiconductor device as claimed in claim 9, wherein the conductive layer is a 3-layer structure of AuGe/Ni/Au.

* * * * *